(12) United States Patent
Ohuchi et al.

(10) Patent No.: US 6,566,747 B2
(45) Date of Patent: May 20, 2003

(54) SEMICONDUCTOR PACKAGE AND PRODUCTION METHOD THEREOF

(75) Inventors: Tsutomu Ohuchi, Adachi-gun (JP); Fumiaki Kamisaki, Adachi-gun (JP)

(73) Assignee: ARS Electronics Co., Ltd., Fukoshima (JP)

( * ) Notice: Subject to any disclaimer, the term of this patent is extended or adjusted under 35 U.S.C. 154(b) by 0 days.

(21) Appl. No.: 09/906,361

(22) Filed: Jul. 16, 2001

(65) Prior Publication Data

US 2003/0011075 A1 Jan. 16, 2003

(51) Int. Cl.[7] .............................................. H01L 23/04
(52) U.S. Cl. ...................... 257/698; 257/784; 257/729
(58) Field of Search ................................ 257/692, 698, 257/784, 700, 723, 724, 686, 774, 729

(56) References Cited

U.S. PATENT DOCUMENTS 5,562,971 A * 10/1996 Tsuru et al.
5,640,048 A * 6/1997 Selna
6,184,577 B1 * 2/2001 Takamura et al.
6,365,979 B1 * 4/2002 Miyajima
6,400,573 B1 * 6/2002 Mowatt et al.

* cited by examiner

*Primary Examiner*—Sheila V. Clark
(74) *Attorney, Agent, or Firm*—Muramatsu & Associates

(57) ABSTRACT

A semiconductor package and its production method in which the semiconductor package is produced by having via holes for electrically connecting top and bottom surface of a double-sided copper clad substrate and cutting the substrate at a line separating the via holes into half. The semiconductor package includes a plurality of wiring patterns on the double-sided copper clad substrate, via holes for interconnecting the top and bottom sides of the substrate and having a long hole shape so that the via hole is shared by adjacent semiconductor packages when the substrate is cut and separated, semiconductor chips mounted on predetermined positions on the substrate, and resin for sealing an entire body of the substrate.

5 Claims, 5 Drawing Sheets

SEMICONDUCTOR PACKAGE AND PRODUCTION METHOD THEREOF

FIELD OF THE INVENTION

The present invention relates to a technology for producing a semiconductor package by forming a plurality of wiring patterns on a double-sided copper clad substrate in a matrix fashion and mounting semiconductor chips on the predetermined positions on the substrate and cutting apart the substrate after sealing the entire body of the substrate by resin. More particularly, the present invention relates to semiconductor packages that are produced by forming via holes for interconnecting the top and bottom sides of the double-sided copper clad substrate at the ends of each semiconductor package and by cutting apart the substrate through a line which separates each via hole into half.

BACKGROUND OF THE INVENTION

In the conventional technology for producing a semiconductor package (hereafter also referred to as "package") after sealing an overall substrate with a resin, a double-sided copper clad substrate (hereafter also referred to as "substrate") is provided with inner terminals for wire connecting a semiconductor chip mounted on a top surface of the substrate. The double-sided copper clad substrate is further provided with via holes or through holes for electrically connecting outer terminals formed at the bottom surface of the substrate. Here, the via holes do not run through the substrate while the through holes run through the substrate.

The above noted via hole is a conductive hole electrically connecting two particular layers on a multi-layered substrate, which is also called an inner via when used in a multi-layered substrate having four layers or more. Compared to the through hole, the via hole is considered superior to the through hole for its high mechanical strength and a process for blocking the resin in a resin sealing process can be omitted.

For commonly using the via holes by packages neighboring to each other, via holes are formed on the outside edges of the packages and are cut into half when separating the resin sealed substrate into a plurality of packages, thereby reducing the required size of the substrate relative to the packages produced.

Conventionally, this via hole formation is done, as disclosed in Japanese Laid-Open Patent Publication No. 10-294400, by methods such as sealing the through holes formed on the substrate with a conductive material such as through electro-plating, or by removing one side layer of the copper clad substrate in a circular shape and forming holes by removing the substrate material (epoxy resin, glass epoxy resin, etc.) by a laser beam in such a way that the copper layer on the other side is remained on the substrate, then treating the inner walls of the holes with the conductive material.

However, the method of forming the through holes disclosed in the above mentioned Japanese Laid-Open Patent Publication No.10-294400 requires a special technology to secure mechanical strength during the process of forming the holes, leading to high cost.

Recently, in forming a multilayered substrate having layers as many as four, six, eight or more, a process called a build-up process is used in which inner vias are created when the substrate layers are stacked together.

Moreover, in the method that forms a via hole from one side of the copper clad layers, the copper clad layer on one surface is removed in a circular shape using an etching method. After this process, a laser beam is used to take away the substrate material to form an opening. The output power of the laser beam is adjusted so that the other side of the copper clad remains intact. An example of this formation process is shown in FIGS. 5A, 5B, and 5C.

This prior art shown in FIG. 5 requires complex and delicate pre-settings. Further, the cross sectional shape of the opening does not show a perfect shape of a circular cylinder. Instead, it is a cylinder with a thinner end portion, i.e., a conical shape. For this reason, as shown in FIG. 5A, remnants of the scraps D or uncut material remains inside of the opening. As a consequence, as shown in FIG. 5B, it is not able to produce an adequate conductive contact area between the metal plating and the copper clad layer on the other side of the substrate when the inside of this via hole is treated with conductive plating. Furthermore, as shown in FIG. 5C, during the cut away process or under a shock produced from an outside force, this contact area is sometimes separated from the copper clad layer because of a thin interface E, resulting in conduction failure.

SUMMARY OF THE INVENTION

Therefore, the present invention has been made to overcome the above-mentioned problems involved in a semiconductor package in which via holes are commonly produced with resin sealing formation of a double-sided copper clad substrate. It is an object of the present invention to provide a semiconductor package and a production method thereof which is capable of securely forming conductive paths using via holes between the top copper layer and the bottom copper layer.

It is a further object of the present invention to provide a semiconductor package and production method thereof in which contact sections in the conductive paths made of via holes will not separate even when the via holes are cut away into half, thereby achieving high reliability and high production yield.

To achieve the above mentioned goals, the semiconductor package and production method of the present invention is comprised of the following:

The semiconductor package of the present invention includes wiring patterns for a plurality of semiconductor packages between top and bottom surfaces of a double-sided copper clad substrate in a matrix manner, via holes (3) as conductive paths each of which connects the top and bottom surfaces of the substrate and has a long hole shape in top view so that the via hole is commonly used by the wiring patterns on both semiconductor packages, semiconductor chips mounted on predetermined positions on the wiring patterns and electrically connecting the chips with terminals, and resin for sealing an entire body of the substrate. Each of the via holes is cut into half along a short diameter when separating the substrate to form two or more semiconductor packages.

Furthermore, in the semiconductor package and production method of the present invention in which the semiconductor package (2) is produced by: forming wiring patterns for a plurality of semiconductor packages (2) between top and bottom surfaces of a double-sided copper clad substrate (1) in a matrix manner, forming via holes (3) as conductive paths each of which connects the top and bottom surfaces of the substrate in a long hole shape so that the via hole is shared by the wiring patterns on both semiconductor packages, attaching semiconductor chips (20) on predetermined positions on the wiring patterns and electrically connecting the chips with terminals, sealing an entire body of the substrate (1) with resin, and cutting the substrate (1) on a line which separates the via hole into half, wherein an opening of each via hole (3) has a long hole shape.

Furthermore, the above mentioned via hole (3) is formed by creating an opening on a copper layer (10) on one side of the double-sided copper clad substrate (1) by removing the copper layer through an etching process, removing a substrate material (11) under the opening to produce cylindrical shaped openings (31) and connecting the cylindrical openings so as to create the opening (31) of a long hole shape.

Moreover, during the resin sealing process, fluorine resin film (40d) may be applied between a female metal mold (40) and sealing resin (25a).

It should be noted that the numerals in the parentheses in the above description are used only for illustration purpose and thus the present invention is not limited to the specific example in the drawings.

BRIEF DESCRIPTIONS OF THE DRAWINGS

Figure 3A:
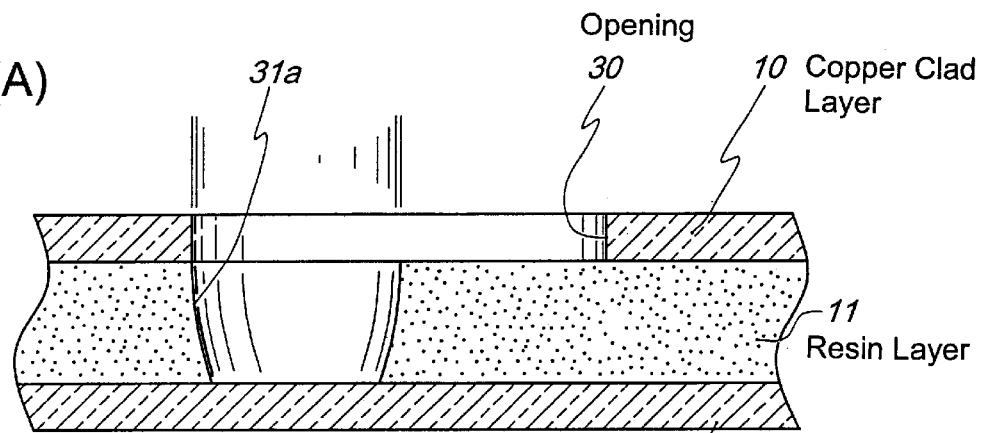
Figure 3B:
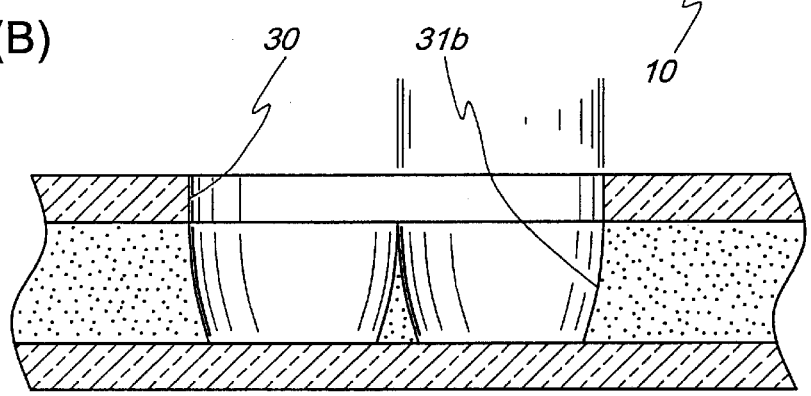
Figure 3C:
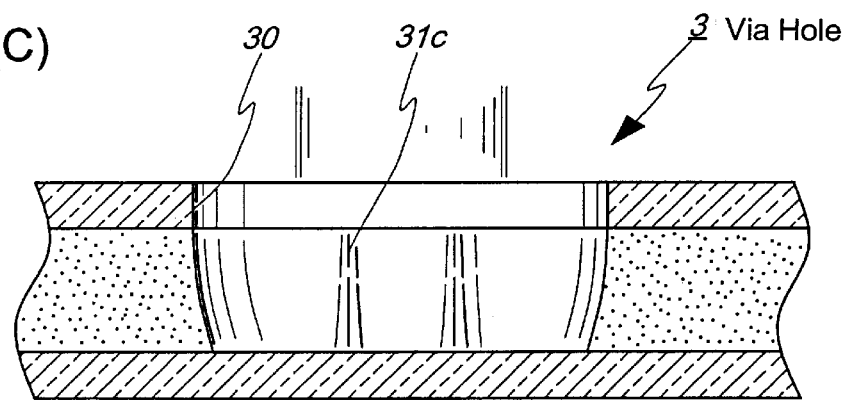

FIGS. 3(A), 3(B), and 3(C) are cross sectional views showing the process for forming the via holes of the present invention.

Figure 4A:
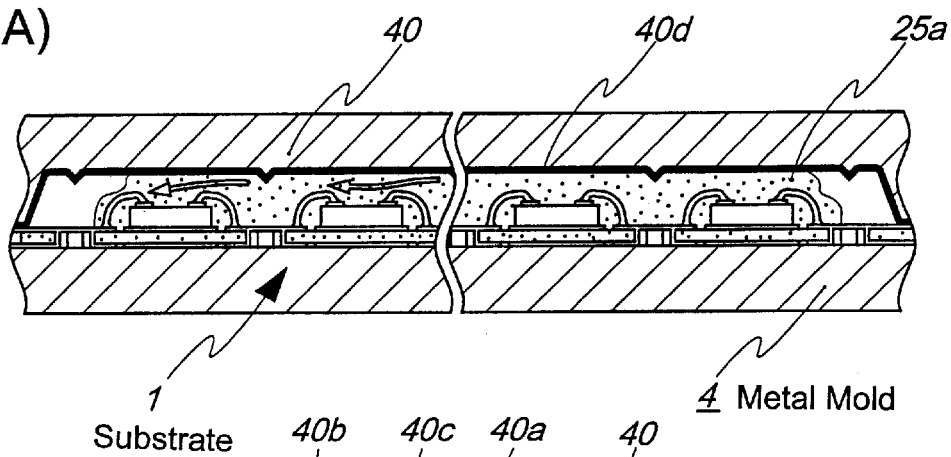
Figure 4B:
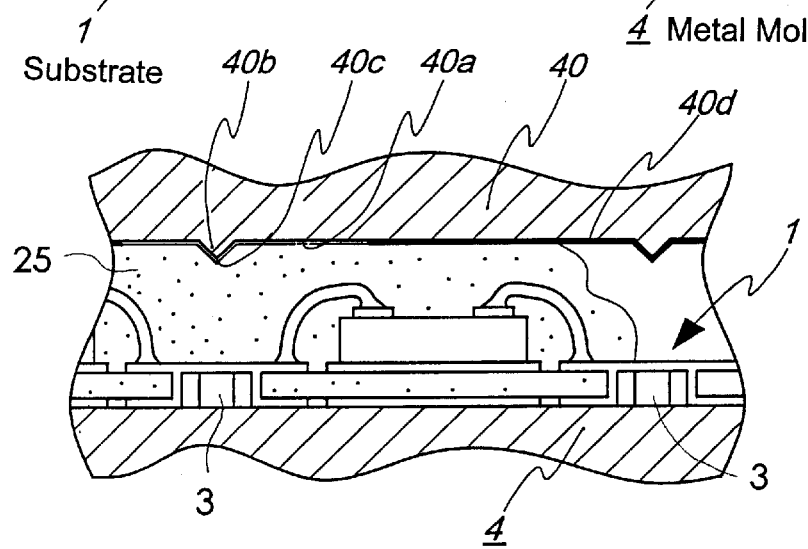
Figure 4C:
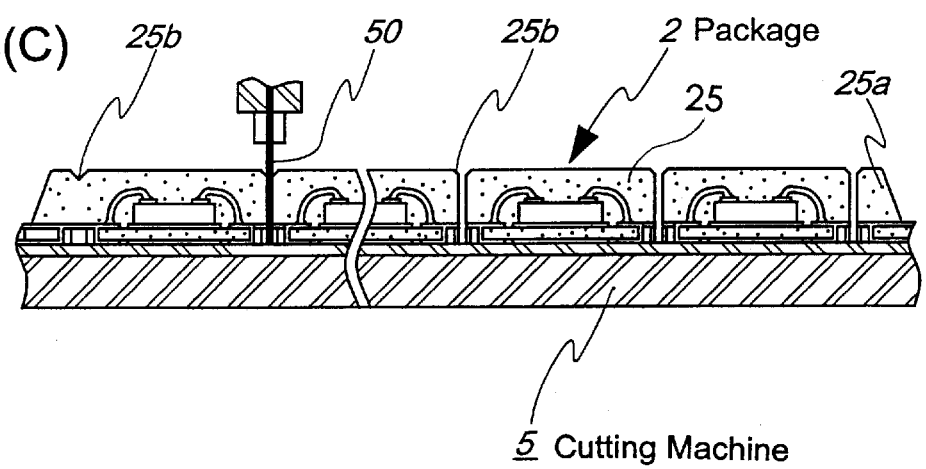

FIGS. 4(A), 4(B), and 4(C) are cross sectional views, respectively showing the resin sealing process, partial enlarged view of the resin sealing process, and the cut away process, in the present invention.

Figure 5A:
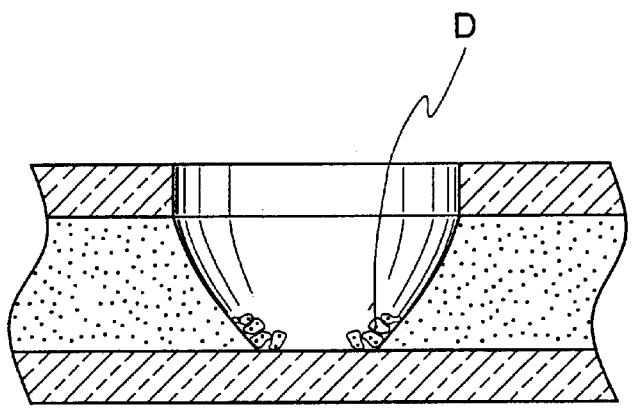
Figure 5B:
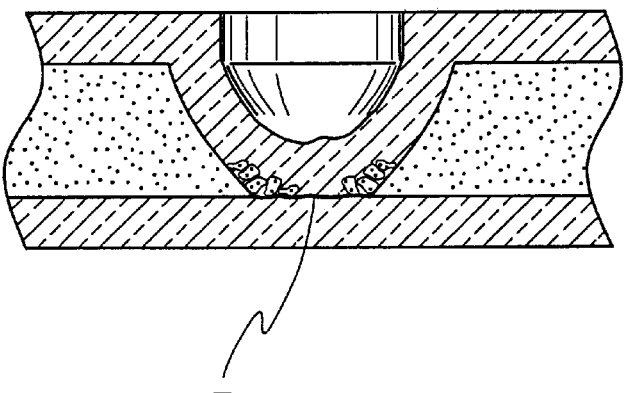
Figure 5C:
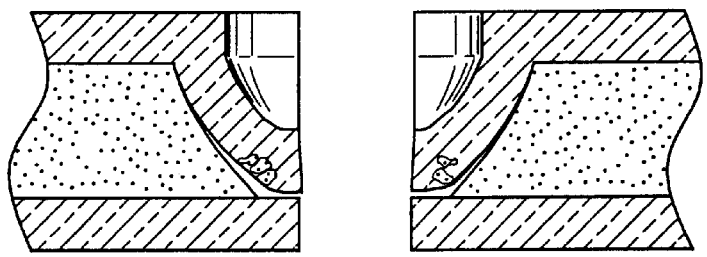

FIGS. 5(A), 5(B), and 5(C) are cross sectional views respectively showing the via holes in the conventional technology.

DETAILED DESCRIPTION OF THE INVENTION

Figure 1:
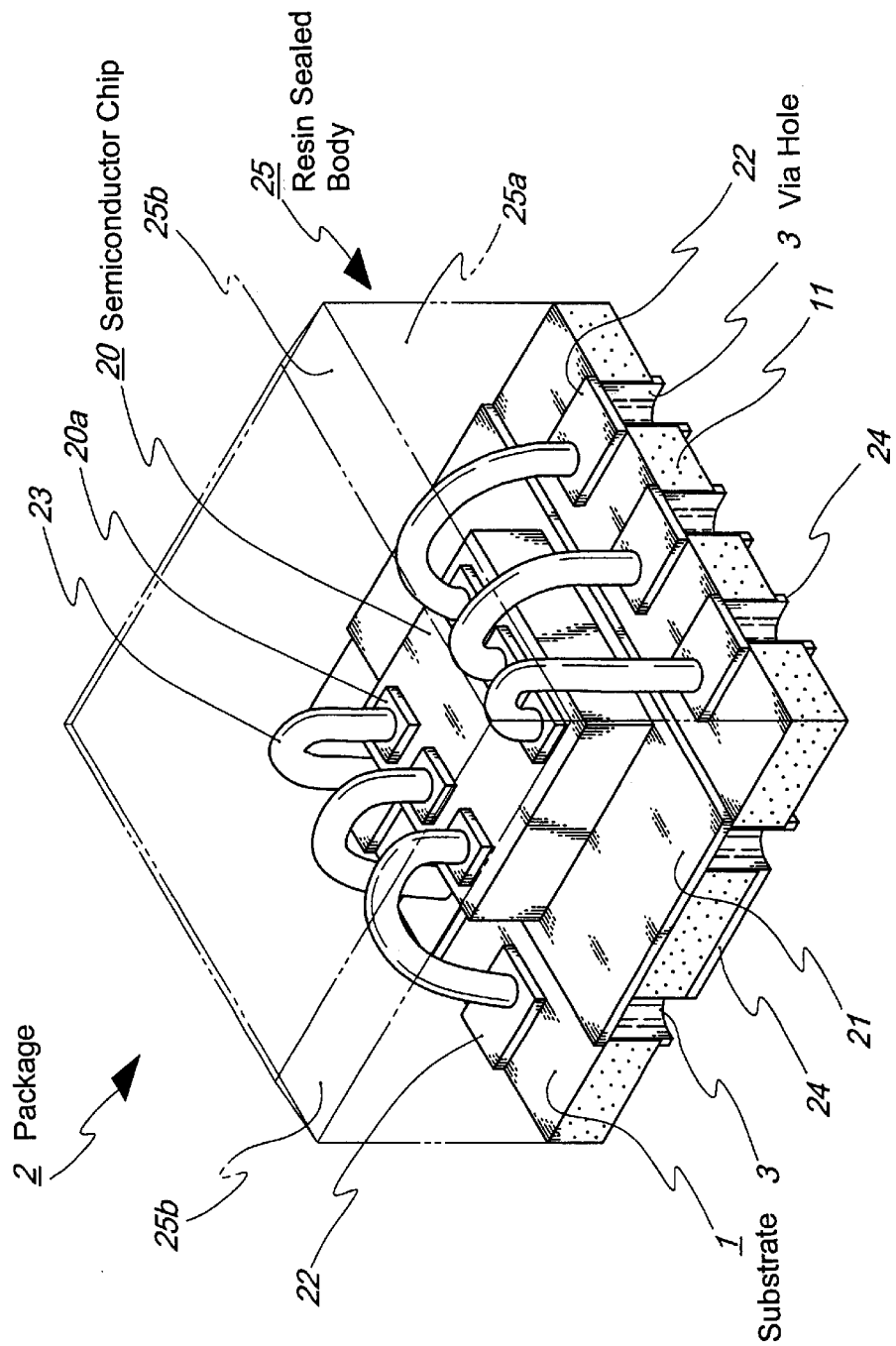
FIG. 1 is a perspective view showing the outer appearance of the semiconductor package of the present invention.
Figure 2:
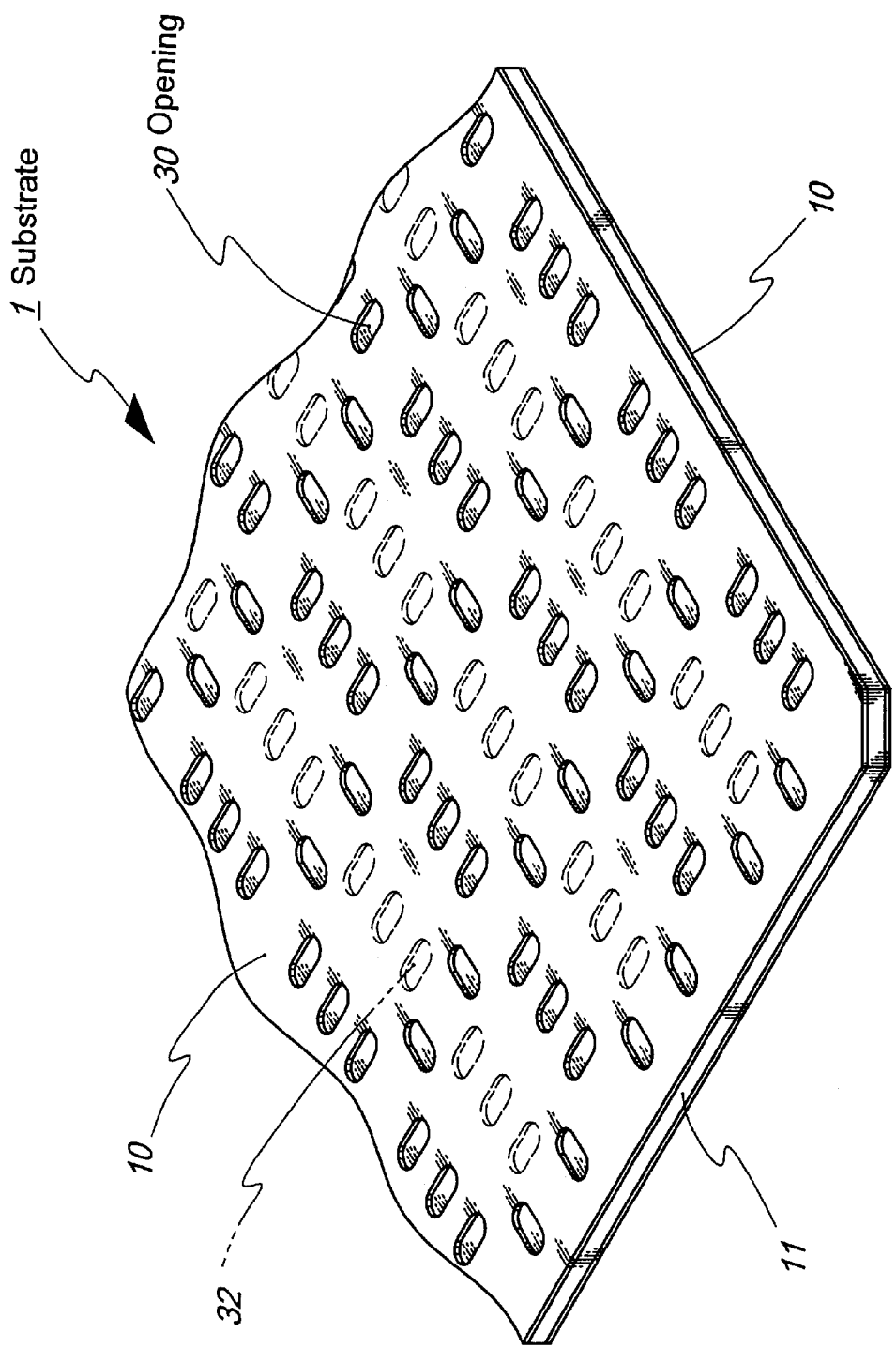
FIG. 2, is a perspective view showing an outer appearance of the substrate provided with the via holes of the present invention.

Preferred embodiment of the semiconductor package and production method of the present invention is described below in detail with reference to the accompanying drawings. FIG. 1 is a perspective view showing the outer appearance of the preferred embodiment of the semiconductor package of the present invention. FIG. 2 is a perspective view showing the appearance of the substrate having the via holes of the present invention. FIGS. 3(A)–3(C) are cross sectional diagrams showing the processes for forming the via holes of the present invention. FIGS. 4(A)–4(C) are cross sectional diagrams showing the resin sealing process, enlarged view of the metal mold, and the cut away process, respectively, of the present invention. FIGS. 5(A)–5(C) are cross sectional diagrams showing the via holes in the conventional technology.

As shown in FIG. 1, one unit of the semiconductor package 2 in the preferred embodiment of the present invention is comprised of a semiconductor chip 20 mounted on a stage 21 of a substrate 1, inner terminals 22 surrounding the stage 21 for connecting the wires, wires 23 that connect between electrodes 20a of the semiconductor chip 20 and the inner terminals 22, outer terminals 24 provided on the bottom surface of the substrate 1, and via holes (half-cut via holes) 3 each originally having a long hole shape located at the ends of the semiconductor package 2 that are cut away in half for connecting the inner terminals 22 and the outer terminals 24. In other words, one original via hole is cut into half thereby creating two half-cut via holes.

Preferred embodiment for forming the via holes 3, which is one of the most essential aspects of the semiconductor package and its production method of the present invention, is described in detail below.

As shown in FIG. 2, on one side of the copper clad layer 10, the predetermined number of openings 30 each having a long hole shape are formed at predetermined positions with use of an etching process. The openings 30 in the embodiment of the present invention have a dimension of, for example, a short diameter of 0.15 mm and a long diameter of 0.35 mm. As shown later, the via holes (half-cut via holes) 3 are formed by cutting these openings 30 vertically into half along the short diameter.

Positions of the openings 30 are determined in such a way that during the later process when the wiring patterns are formed in a matrix manner, the openings 30 are placed at the edges of these patterns and positioned so that, when the via holes 3 are cut at the center line of the long holes, the almost identical dimensions of openings are remained in the two neighboring packages. Moreover, to improve the heat dissipation efficiency, heat dissipation via holes 32 may be formed on the inner area of the semiconductor package 2 (shown by the dotted lines in FIG. 2).

Next, as shown in FIG. 3(A), a cylindrical hole 31a (one end) is produced using a laser beam with its output power finely tuned so that the laser beam creates the cylindrical hole at one end of the longitudinal direction of the opening 30 by removing the resin layer 11 without damaging the copper clad layer on the bottom surface (back side). After that, as shown in FIG. 3(B), a cylindrical hole 31b (other end) is formed at other end of the longitudinal direction of the opening 30 by removing the resin layer 11. Finally, as shown in FIG. 3(C), a cylindrical hole 31c (intermediate) is created at the middle of the two holes created in the above procedures by removing the remaining resin layer 11.

As a consequence, the holes 31a, 31b, 31c are created which are consecutive with one another, thereby forming the via hole 3 with the long opening 30. Then, conductive treatment is performed on the via hole 3 by applying an electroplating method. In the foregoing process, the via holes 3 of the preferred embodiment of the present invention are curved slightly at the bottom as shown in FIG. 3(C), however, because of the long hole, a large contact area is attained. Furthermore, because of the formation of the long opening 30, the bottom capacity of the via hole is larger than that of the conventional technology shown, for example, in FIGS. 5(A)-5(C), therefore, it is possible to easily remove the remaining debris of resin.

In the preferred embodiment of the present invention, the laser machining is carried out by a laser drill machine with galvanostat system for high speed execution (for example, 1,000 holes per second).

Then, as with the conventional technology, the wiring patterns on the stage 21, the inner terminals 22 and the outer terminals 24 are respectively formed at predetermined positions with predetermined numbers using photolithography process including exposure, development, and dissolution. Then, the semiconductor chip 20 is mounted on the stage 21 (FIG. 1) of the substrate 1, and after mounting the chip, wiring connection is established.

Then, as shown in FIG. 4(A), the entire substrate 1 is attached to a metal mold 4 to fill in resin 25a for resin sealing to form a resin sealed body 25. As shown in an enlarged view of FIG. 4(B), on the bottom side 40a of the female mold 40 of the metal mold 4 has projections 40b each having a V-shape in cross section in a matrix manner on its surface. Each ridge 40c of the projection 40b is positioned to match the vertical line that would connect the center of via hole 3 on the substrate 1.

Therefore, because of these projections 40b, the V-shaped grooves 25b (hereafter V-groove) are formed in the matrix manner on the top surface of the resin sealed body 25 at the positions that vertically match the via holes 3. Furthermore, to easily detach the female metal mold 40 and the resin 25a, a fluorine resin film 40d is applied to the bottom surface of the female metal mold 40.

Finally, as shown in FIG. 4(C), the entire substrate 1 is detached from the metal mold 4, then it is placed on a cutting machine 5 to cut into each unit of the package 2 by a cutting blade 50 along the V-groove. The thickness of the cutting blade 50 is determined so that it would not exceed the inner diameter of the via holes 3, therefore, each via hole 3 is separated into two to function as conduction means between the inner terminal 22 and the outer terminal 24 on each of the two neighboring packages 2. Furthermore, since the separated surfaces of these via holes 3 are substantially the same as that of the separated surfaces of the resin sealed body 25 of the package 2, the substrate 1 would not be projected from the outer surface of the package 2, thereby minimizing the overall size.

The via holes of the above mentioned semiconductor package and its production method thereof are formed with the shape of the long opening, thus, the conductive sections have a larger physical connection strength when performing the conductive treatment for the inner surface thereof. Further, because of this structure, in the process for cutting the via holes into half, the via holes have a higher endurance against the separation, thereby achieving higher reliability in the electrical connection of the packages.

Accordingly, the foregoing advantages further contribute to improving the yield of the package production, thereby enabling to further increase the production efficiency and to reduce the production cost.

What is claimed is:

1. A semiconductor package, comprising:

a double-sided copper clad substrate having a top surface and a bottom surface;

wiring patterns running between the top and bottom surfaces of the double-sided copper clad substrate;

via holes for establishing conductive paths each of which connects the top and bottom surfaces of the substrate, each of the via holes having a long hole shape in top view wherein each via hole is cut into half along a short diameter thereof to create two half-cut via holes when separating the substrate to form two or more semiconductor packages; and semiconductor chips mounted on predetermined positions on the substrate and electrically connected to terminals;

wherein one of the half-cut via holes created from an original via hole is established at an outer edge of one separated semiconductor package while another half-cut via hole created from the original via hole is established at an outer edge of another separated semiconductor package.

2. A semiconductor package as defined in claim 1, further comprising resin for resin sealing the top surface of the double-sided copper clad substrate having the semiconductor chip mounted thereon.

3. A semiconductor package as defined in claim 1, wherein said wiring patterns are formed in a matrix manner on the surfaces of the double-sided copper clad substrate.

4. A semiconductor package as defined in claim 1, wherein each of said via holes with the long hole shape has a longer diameter of about 0.35 mm and a short diameter of about 0.15 mm.

5. A semiconductor package as defined in claim 1, wherein said semiconductor chip mounted on said substrate is electrically connected to the terminals at least one of said terminals is connected to said half-cut via hole.

* * * * *